United States Patent
Kerr et al.

(10) Patent No.: US 7,292,760 B2
(45) Date of Patent: Nov. 6, 2007

(54) OPTICAL CONVERTER FORMED FROM FLEXIBLE STRIPS

(75) Inventors: Roger S. Kerr, Brockport, NY (US); Ronald S. Cok, Rochester, NY (US); David Kessler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 150 days.

(21) Appl. No.: 10/314,843

(22) Filed: Dec. 9, 2002

(65) Prior Publication Data
US 2004/0108046 A1 Jun. 10, 2004

(51) Int. Cl.
*G02B 6/04* (2006.01)
*G02B 6/06* (2006.01)

(52) U.S. Cl. .................. 385/120; 385/116; 385/114
(58) Field of Classification Search ......... 385/115–121
See application file for complete search history.

(56) References Cited

U.S. PATENT DOCUMENTS

| | | | |
|---|---|---|---|
| 3,033,731 A | 5/1962 | Cole | |
| 3,141,106 A * | 7/1964 | Kapany | 313/475 |
| 3,989,578 A | 11/1976 | Hashimoto | |
| 5,009,475 A * | 4/1991 | Knudson | 385/116 |
| 5,160,565 A * | 11/1992 | Chazalon et al. | 156/242 |
| 5,204,927 A | 4/1993 | Chin et al. | |
| 5,376,201 A | 12/1994 | Kingstone | |
| 5,465,315 A * | 11/1995 | Sakai et al. | 385/116 |
| 5,502,457 A * | 3/1996 | Sakai et al. | 345/87 |
| 5,572,034 A | 11/1996 | Karellas | |
| 5,615,294 A | 3/1997 | Castonguay | |
| 5,938,812 A | 8/1999 | Hilton, Sr. | |
| 6,195,016 B1 | 2/2001 | Shankle et al. | |
| 6,198,872 B1 * | 3/2001 | Lipson et al. | 385/117 |
| 6,304,703 B1 | 10/2001 | Lowry | |
| 6,318,901 B1 * | 11/2001 | Heremans et al. | 385/53 |
| 6,418,254 B1 | 7/2002 | Shikata et al. | |
| 6,522,816 B1 * | 2/2003 | Sugawara | 385/116 |
| 2003/0113088 A1 * | 6/2003 | Takeya et al. | 385/136 |

* cited by examiner

*Primary Examiner*—Sung Pak
(74) *Attorney, Agent, or Firm*—Andrew J. Anderson

(57) ABSTRACT

A fiber optic faceplate fabricated using a series of stacked ribbon structures. Each ribbon structure comprises optical fiber segments that run from an input edge to an output edge with fixed input and output fiber-to-fiber spacing. Input and output edge spacers may be used to provide spacing between stacked ribbon structures. Ribbon structures may be provided individually or as one or more sheets of ribbon structures.

18 Claims, 13 Drawing Sheets

OPTICAL CONVERTER FORMED FROM FLEXIBLE STRIPS

FIELD OF THE INVENTION

This invention generally relates to fabrication of fiber optic faceplates as optical converters for use in imaging systems and more particularly relates to a fiber optic faceplate fabricated from flexible strips containing multiple light guides.

BACKGROUND OF THE INVENTION

One advantage of electronic display systems is the capability to display an image in a variety of formats and sizes. There is particular interest in providing large scale displays, visible to thousands of viewers over considerable distance, such as would be useful for entertainment and advertising. One known method for providing large scale electronic displays is tiling, in which a matrix of smaller displays are linked together to form a larger display surface.

Image-forming devices such as LCDs, matrixed LEDs, Organic Light Emitting Diodes (OLEDs), and PLEDs provide a two dimensional image in pixel form, with pixels familiarly arranged in rows and columns. A recognized problem for displays using these components relates to inherent dimensional limitations of the electronic image-forming components themselves. Size and packaging requirements for these devices constrain their use in large-scale display applications, requiring special methods and techniques for image enlargement and tiling.

It has been recognized that optical fibers afford one means for enlarging an electronically generated image in order to display the image in a larger format, such as for tiling applications. For example, U.S. Pat. No. 6,195,016 B1 issued Feb. 27, 2001 to Shankle et al. discloses an enlarged display using images provided from conventional transparencies, visibly enlarged by means of fiber optic light guides, each fiber painstakingly routed from the image forming device to a display panel. Similarly U.S. Pat. No. 6,418,254 B1 issued Jul. 9, 2002 to Shikata et al. discloses a fiber optic display coupled with an image projector. U.S. Pat. No. 6,304,703 B1 issued Oct. 16, 2001 to Lowry discloses a tiling implementation using bundles of optical fibers routed from image-forming components to a display apparatus.

As an alternative to routing individual fibers, symmetrically fixed groupings of optical fibers are preferred. For example, U.S. Pat. No. 5,465,315 issued Nov. 7, 1995 to Sakai et al. discloses a tiled display employing LCD devices, with images tiled on a display surface using a fiber optic faceplate. Fiber optic faceplates have also been disclosed for use in a number of other applications, such as U.S. Pat. No. 5,572,034 issued Nov. 5, 1996 to Karellas which discloses tiling using fiber optic faceplates in an X-ray imaging apparatus and U.S. Pat. No. 5,615,294 issued Mar. 25, 1997 to Castonguay which discloses use of a tapered fiber optic faceplate in light-sensing instrumentation.

Fiber optic faceplates that are commercially available are well suited for many types of image-sensing and instrumentation purposes. However, the overall requirements for using fiber optic faceplates as optical converters for electronic image display are more demanding, particularly when used with LCD, LED, OLED, or PLED devices. In such a case, it is important to have precise positioning of optical fibers at the input and output sides of a fiber optic faceplate. That is, each pixel at the image-forming device has a corresponding fiber light guide within the fiber optic faceplate that directs light from that pixel to the output display surface. This requirement necessitates custom design of a fiber optic faceplate for the geometry of the image forming device itself (such as for an OLED, for example) and for the geometry of the display surface. It can be appreciated that tiling arrangements introduce even more complexity into the faceplate fabrication problem. As a result, fiber optic faceplates suitable for electronic image display continue to be costly and difficult to fabricate. Solutions for fiber optic faceplate fabrication, such as those disclosed in PCT International Application WO 02/39155 A2 by Cryan et al., published May 16, 2002 can be highly dependent on accurate dimensions of the optical fiber or of interstitial fillers used to provide a precise spacing between fibers.

One prior art approach for providing accurate positioning of optical fibers in a fiber bundle is disclosed in U.S. Pat. No. 3,989,578 issued Nov. 2, 1976 to Hashimoto, hereinafter termed the '578 patent. In the method of the '578 patent, directed to the manufacture of fiberscope apparatus, optical fiber is wound around a mandrel and aligned in guide frames to obtain precise positioning. In U.S. Pat. No. 5,938,812 issued Aug. 17, 1999 to Hilton, Sr., hereinafter termed the '812 patent, a multilayer fiber optic bundle is fabricated by winding a fiber optic strand around a drum, within a plastic channel. In U.S. Pat. No. 3,033,731 issued May 8, 1962 to Cole, hereinafter termed the '731 patent, fiber is wound about a mandrel to form rows, which can then be combined to build up a fiber structure. Thus, it can be seen that a drum or mandrel, properly dimensioned, can be a suitable apparatus for positional arrangement of optical fibers in a bundle. However, neither the '578, '812, nor '731 patents provide a suitable solution for optical fiber faceplate fabrication. The methods used in the above-mentioned patents position fibers adjacently, so that the dimensions of the fiber itself determine center-to-center spacing of the fiber bundle. However, such methods are highly dependent on the uniformity of fiber dimensions. In actual practice, however, the actual dimensions of optical fiber can vary widely, even for the same type of fiber. Additional tolerance error is due to winding tension differences as the fiber strands are wound about the drum. More significantly, however, the methods of the '578, '812, and '731 patents do not provide a way to vary the center-to-center spacings between fibers, both at input and at output ends of the fiber bundle. As is noted earlier, the capability for varying the center-to-center spacing between fibers, lacking with the methods of the 578, '812, and '731 patents, is of paramount importance for display imaging applications.

In an attempt to meet the requirements for variable center-to-center spacing, U.S. Pat. No. 5,204,927 issued Dec. 27, 1994 to Chin et al., hereinafter termed the '927 patent, discloses the use of pairs of axially disposed spacer bars. The use of spacer bars allows a fiber optic bundle to have different fiber spacing at input and output ends. Similarly, U.S. Pat. No. 5,376,201 issued Dec. 27, 1994 to Kingstone, hereinafter termed the '201 patent, discloses the use of spacer guides in a rotating drum application for output fiber spacing, where the output spacer guides, added as each layer of fiber is formed, become part of the completed fiber bundle assembly.

While the '927 and '201 disclosures suggest helpful fabrication techniques for fiber optic couplers, there is felt to be considerable room for improvement. In particular, neither the '927 nor the '201 disclosure are well suited to the requirements for accurate, high-speed, and inexpensive fabrication of fiber optic faceplates used for electronic display imaging. With respect to both '927 and '201 disclosures, curvature effects of the rotating drum constrain the attainable size of a fiber optic faceplate built up in this way. Continuous feeding of optical fiber is necessary, which suggests a substantial amount of waste with the '927 and '201 methods. The method of the '201 disclosure relies heavily on precision manufacture of grooved spacer components, incorporated into the body of the fiber faceplate itself, used to define the spacing of each output row and to set the spacing between rows. Moreover, new spacers are required to be accurately positioned as each row of fibers is wound. This adds cost and complexity to the fabrication process.

Overall, it can be seen that there is a need for improved methods for fabrication of fiber optic faceplates, particularly for electronic imaging applications.

SUMMARY OF THE INVENTION

The present invention provides improved apparatus and methods for fabrication of fiber optic faceplates. With this object in mind, the present apparatus provides a fiber optic faceplate comprising a series of stacked ribbon structures: each ribbon structure comprising a single row of parallel disposed optical fibers, each optical fiber running from an input edge to an output edge of said ribbon structure, the length of each optical fiber thereby determining a depth dimension of said ribbon structure, each fiber having, relative to an adjacent fiber, an input spacing at said input edge and an output spacing at said output edge for directing light from an input position to an output position respectively.

From another aspect, the present invention provides a method for forming an optical converter comprising: (a) forming a plurality of ribbon structures, each ribbon structure having a ribbon width defined by an input edge and an output edge and having a single row of side-by-side light pipe segments, each light pipe segment providing an optical path from an input at said input edge to an output at said output edge; (b) successively stacking said ribbon structures atop one another to build up said optical converter as a stack of adjacent rows of said light pipe segments.

It is a feature of the present invention that it fabricates and employs an innovative ribbon structure that serves as a basic building-block for assembling a fiber optic faceplate of the desired dimensions, shape, and optical properties.

It is an advantage of the present invention that it is easily adaptable for fabrication of a wide range of fiber-optic faceplate formats and shapes, at low cost relative to conventional methods.

It is a further advantage of the present invention that it relaxes dimensional constraints on fiber optic strands themselves for faceplate fabrication. The present invention allows fabrication of faceplates having thinner depths than are currently available using conventional methods.

It is yet a further advantage of the present invention that it affords considerable flexibility for providing a tapered fiber faceplate arrangement, allowing variable fiber-to-fiber spacing for both sides of a fiber faceplate.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 12:
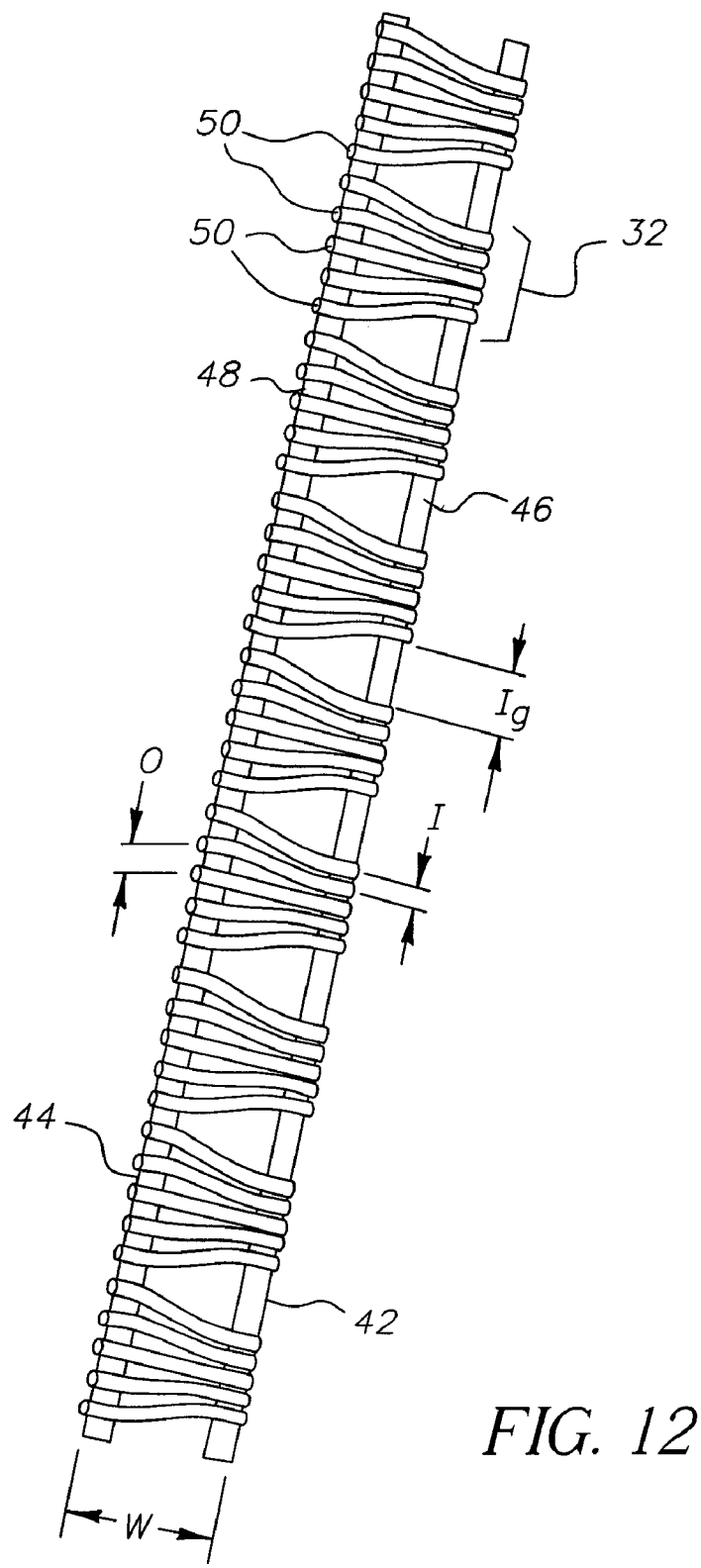
FIG. 12 shows a ribbon structure made according to the present invention.

In order to understand the particular apparatus and methods applied using the present invention for fabricating fiber optic faceplates, it is most instructive to look first at the basic structural building block fabricated using the apparatus of the present invention and used for assembling the fiber optic faceplate. Referring to FIG. 12, there is shown a portion of a ribbon structure 40 which serves as a novel elemental component for fiber optic faceplate fabrication. Ribbon structure 40 comprises an array of optical fiber segments 50, generally disposed parallel to each other, for guiding light from an input edge 46, over width W, to an output edge 48. Fiber segments 50 on input edge 46 have an input edge fiber-to-fiber spacing I. An input edge spacer 42 maintains the fixed input edge fiber-to-fiber spacing I and also determines an input edge distance between ribbon structures 40 when stacked, as is described subsequently. Fiber segments 50 may also be grouped to form a fiber group 32; with such an arrangement, there would be an input edge fiber group distance $I_g$ between fiber groups 32 at input edge 46. Similarly, fiber segments 50 on output edge 48 have an output edge fiber-to-fiber spacing O. An output edge spacer 44 maintains the fixed output edge fiber-to-fiber spacing O and also determines an output edge distance between successive ribbon structures 40 when stacked against each other, as is described subsequently.

Figure 1:
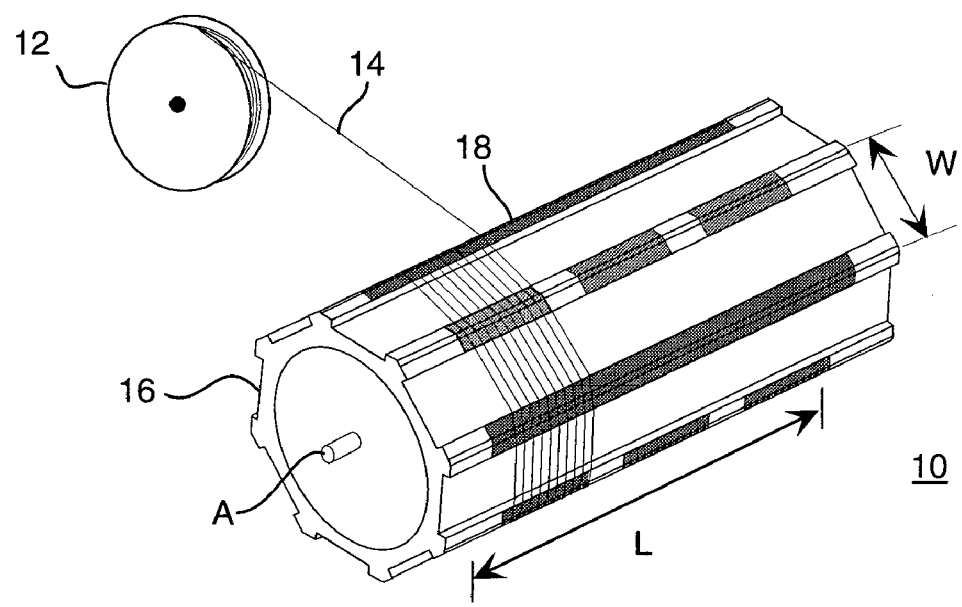
FIG. 1 is a perspective view showing an apparatus for fiber faceplate fabrication according to the present invention.

Referring to FIG. 1, there is shown a perspective view of a fiber optic faceplate forming apparatus 10 and the components used for a first phase of ribbon structure 40 fabrication. Fiber optic faceplate forming apparatus 10 comprises a fiber optic source 12 that provides an optical fiber strand 14 that is wound around a mandrel 16. The components shown in FIG. 1 cooperate to wrap optical fiber strand 14 in a generally spiral fashion about mandrel 16, rotating about an axis A to form a wound spiral 18 of the thickness of a single fiber strand 14. The wound spiral 18 is thus formed circumferentially about mandrel 16, up to some predetermined length L. Recalling FIG. 12, each ribbon structure 40 that is formed has width W and length L as shown in FIG. 1.

Figure 2:
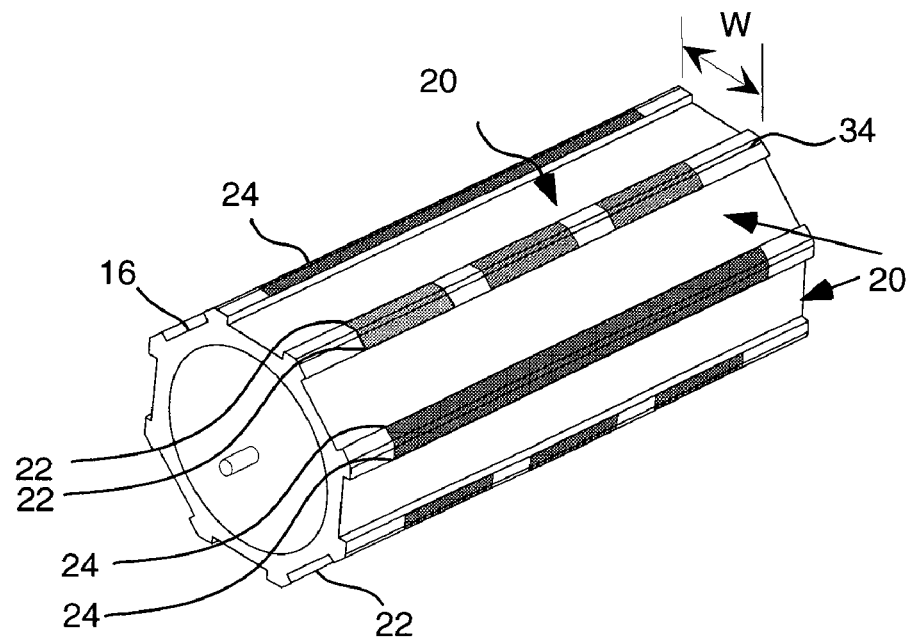
FIG. 2 is a perspective view of the mandrel used for optical fiber winding.

As is shown more clearly in FIG. 2, mandrel 16 comprises one or more ribbon forming channels 20, each ribbon forming channel 20 defined by a pair of spacing guides: an input spacing guide 22 and an output spacing guide 24. In order to form ribbon structure 40 of width W, input and output spacing guides 22 and 24 are spaced about W distance apart. In the arrangement of FIGS. 1 and 2, a particularly preferred embodiment for reasons described subsequently, input spacing guides 22 in adjacent ribbon forming channels 20 are themselves adjacent; similarly, output spacing guides 24 in adjacent ribbon forming channels 20 are adjacent, with a cut groove 34 between adjacent input and output spacing guides 22 and 24 for severing ribbon structures 40 from each other. However, other arrangements are possible.

Around the circumference of mandrel 16, ribbon forming channels 20 may all have the same width W dimension. However, it may be advantageous to increase the width W dimension by changing the relative positions of input and output spacing guides 22 and 24. Input and output spacing guides 22 and 24 may be fixed in position on mandrel 16 or may be adjustable, secured mechanically or magnetically, for example. Fiber optic source 12 is preferably moved along the direction of axis A as optical fiber strand 14 is wrapped into input and output spacing guides 22 and 24, using mechanical winding methods well known in the mechanical arts.

Figure 3A:
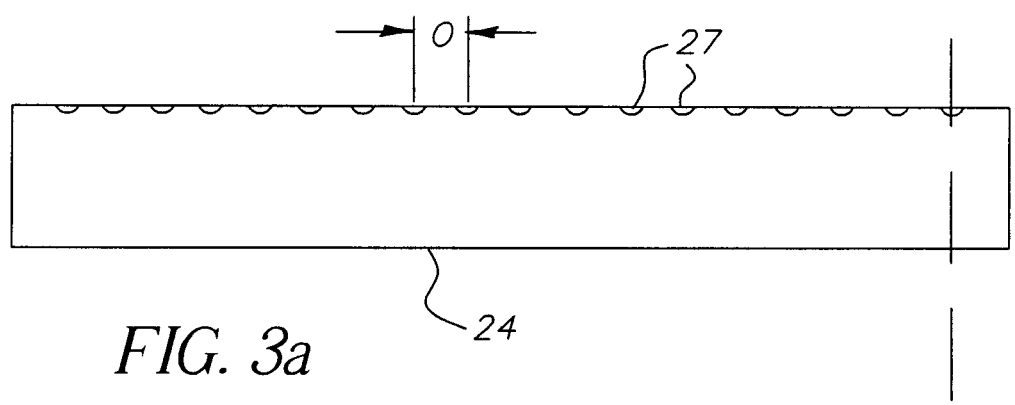
FIGS. 3a and 3b are side views of spacing guides along the mandrel for the output and input edges respectively of a fiber ribbon structure made according to the present invention.
Figure 3B:
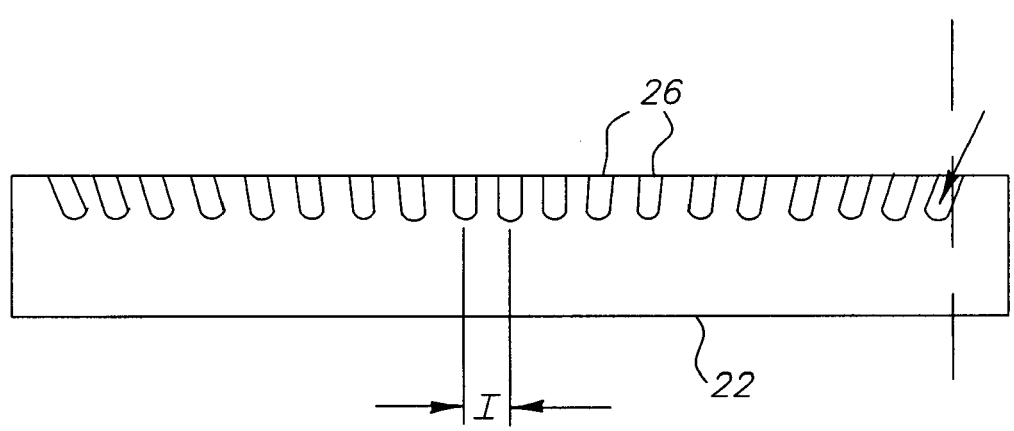

Referring to FIGS. 3a and b, an enlarged cross section of a small segment of an input spacing guide 22 and an output spacing guide 24, respectively are shown. Grooves 27 locate the fiber at the output edge of the ribbon structure 40 to have an output fiber-to-fiber spacing O. Grooves 26, which have openings which are spaced the same as grooves 27 are variably angled such that their bottoms provide input edge fiber-to-fiber spacing I less than O. To make a fiber optic face plate where the input and output fiber-to fiber spacings are the same, both the input and output spacing guides would be identical. A preferred embodiment uses machined grooves, however, alternate arrangements such as using pin mechanisms could be employed, provided that the correct input edge fiber-to-fiber spacing I or output edge fiber-to-fiber spacing O is maintained. Depending on how ribbon structures 40 are used to fabricate a fiber optic faceplate, input and output spacing guides 22 and 24 may be differently dimensioned or have different spacing between them over different parts of mandrel 16. Optional cut groove 34 may be provided between adjacently disposed input or output spacing guides 22 or 24, as shown.

Figure 4:
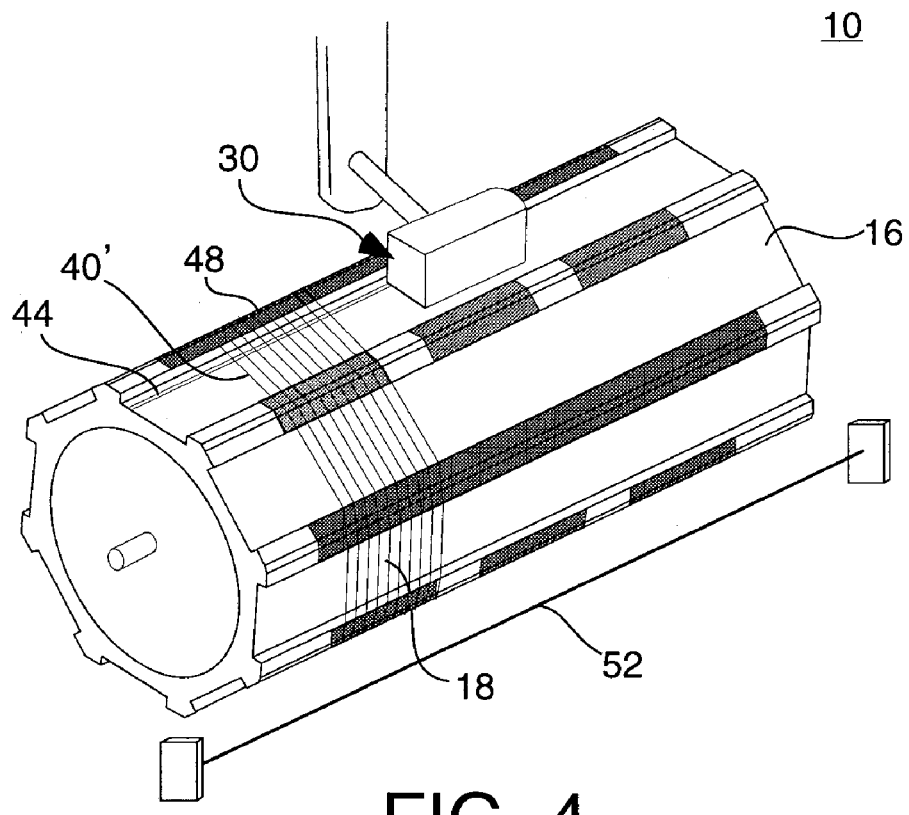
FIG. 4 is a perspective view showing auxiliary components used in the apparatus for fiber faceplate fabrication.

Referring to FIG. 4, there is shown a perspective view of a fiber optic faceplate forming apparatus 10 and the components used for a second phase of ribbon structure 40 fabrication. Once wound spiral 18 is wound about mandrel 16, it is necessary to fix the relative input edge fiber-to-fiber spacing I and output edge fiber-to-fiber spacing O that were provided in the first phase of fabrication that was shown in FIG. 1. For this purpose, an edge spacer applicator 30 applies output edge spacer 44 atop wound spiral 18 along output edge 48 of a partially fabricated ribbon structure 40'. In a preferred embodiment, output edge spacer 44 comprises an adhesive backing, allowing it to be applied in like manner as an adhesive tape.

It must be observed that there can be a number of alternative methods for applying input and output edge spacers 42, 44. For example, it may be preferred to apply an adhesive directly to wound spiral 18, where the adhesive does not attach itself to mandrel 16 components. Other methods of fixing may use heated application of input or output edge spacers 42, 44, such as using a thermally set plastic for example. The order in which input or output edge spacers 42 or 44 are applied may also be varied, depending on the order in which ribbon structures 40 are stacked, for example. Thus, it may be best to apply input or output edge spacers 42, 44 for alternate ribbon forming channels 20 at different times, one set prior to forming wound spiral 18 and another set after wound spiral 18 is formed.

Once input and output edge spacers 42 and 44 are applied, completed ribbon structures 40 can be removed from mandrel 16. Ribbon structures 40 can be separated from each other by a number of methods for severing optical fibers, well known in the art. In the embodiment of FIG. 4, for example, a heated nichrome wire 52 is applied against mandrel 16 to separate assembled ribbon structures 40. Other methods can be used, such as removing assembled ribbon structures 40 as a complete sheet or sleeve, as is described subsequently.

Input and output edge spacers 42 and 44 could be fabricated from a number of different materials and could be tape, plastic, adhesive, or molded, for example.

Figure 5:
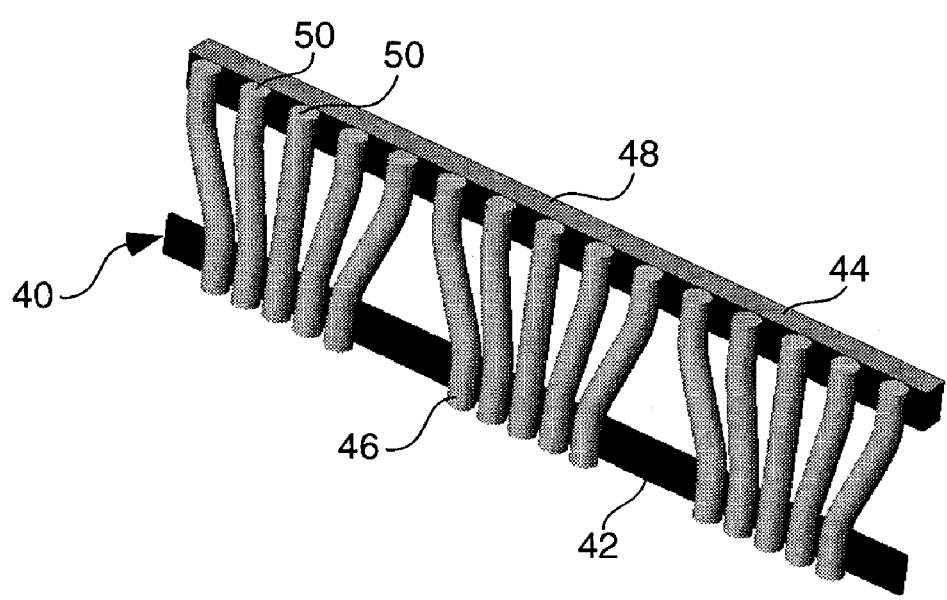
FIG. 5 is a perspective view showing a small portion of the ribbon structure of a component of a fiber faceplate made according to the present invention.

FIGS. 5 through 11 illustrate how ribbon structures 40, fabricated as described hereinabove, can be combined in order to construct fiber optic faceplates. Referring to FIG. 5, there is shown, in perspective view, a small segment of ribbon structure 40, constructed of individual optical fiber segments 50 and input and output edge spacers 42 and 44.

Figure 6A:
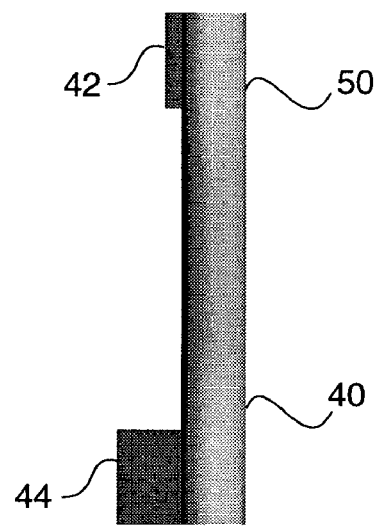
FIGS. 6a, 6b, 6c, and 6d show, from a side view, the progression of steps used for forming a plurality of ribbon structures into a fiber optic faceplate.
Figure 6B:
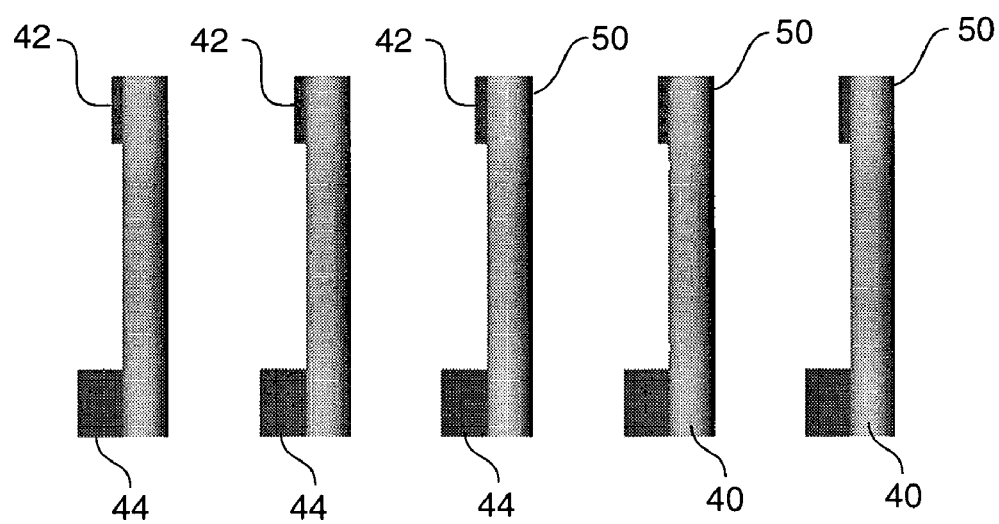
Figure 6C:
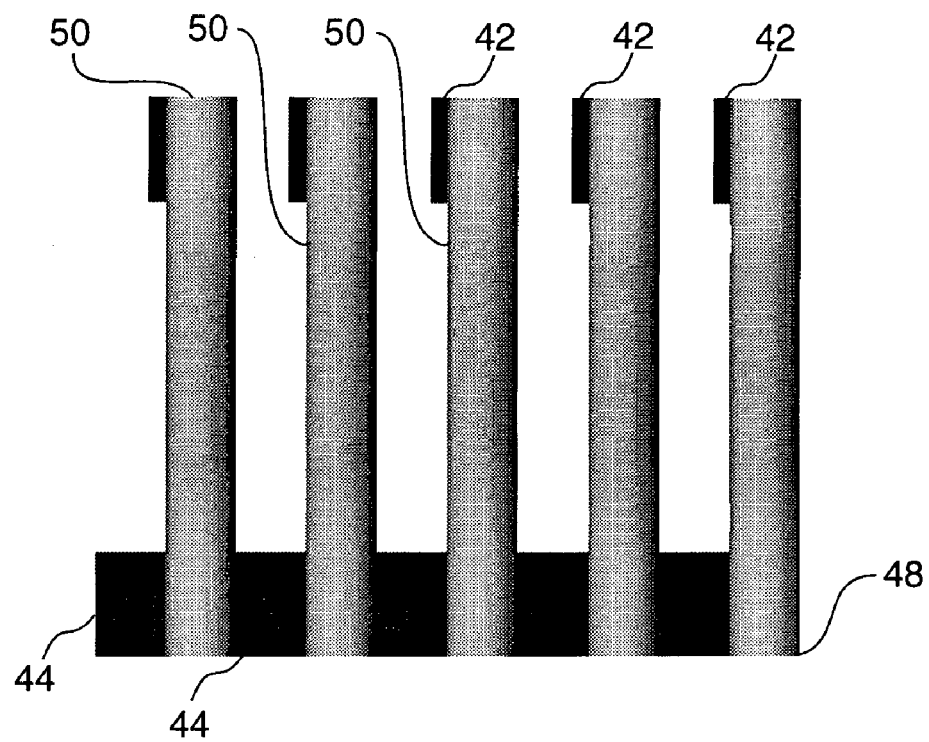
Figure 6D:
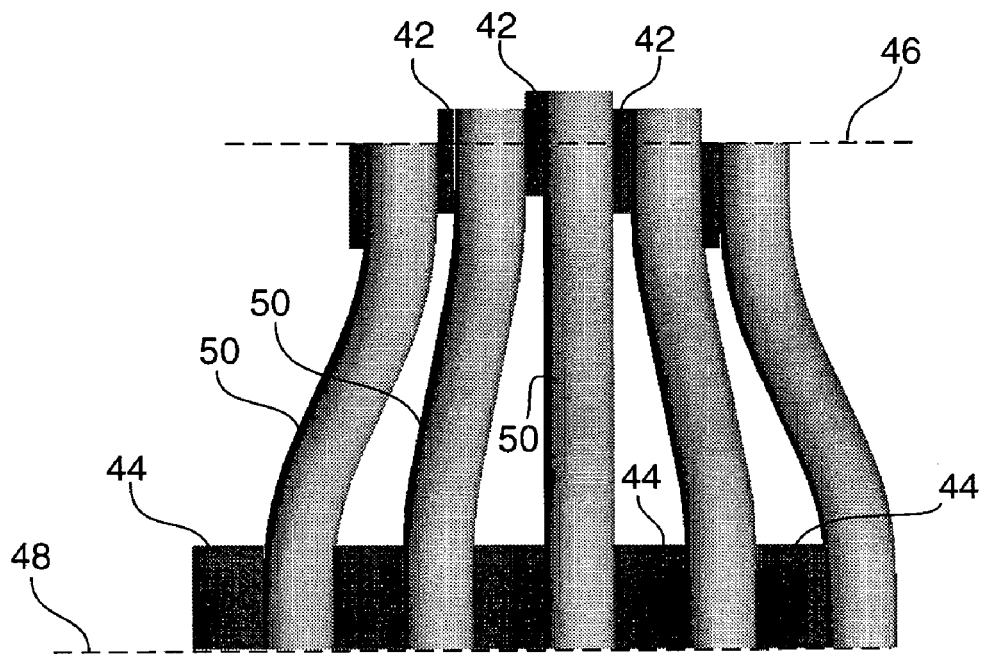

FIGS. 6a through 6d show, using side views, how successive ribbon structures 40 are stacked against each other as part of optical fiber faceplate fabrication. FIG. 6a shows a single ribbon structure 40. FIG. 6b shows multiple ribbon structures 40 lined up symmetrically, with input and output edge spacers 42 and 44 having the proper orientation for stacking. FIG. 6c shows how output edge 48 is assembled, with output edge spacers 44 disposed between optical fiber segments 50. FIG. 6d shows how input edge 46, represented by a dotted line, is then formed. As suggested in FIG. 6d, some trimming at input edge 46 may be required for maintaining flatness.

Figure 7A:
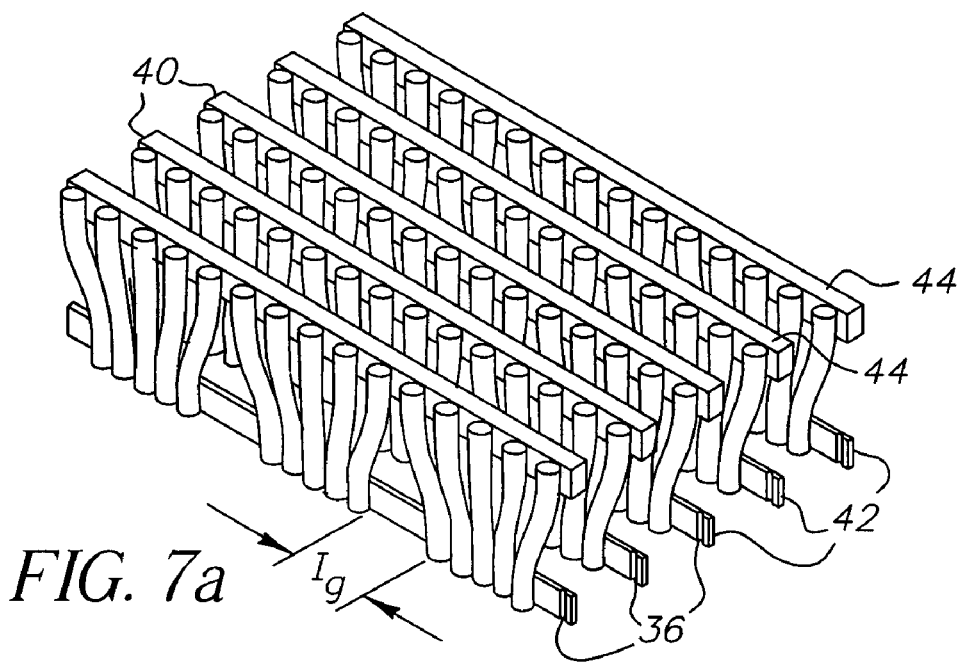
FIGS. 7a and 7b show exploded and assembled views respectively for fiber optic fabrication using the method of the present invention.
Figure 7B:
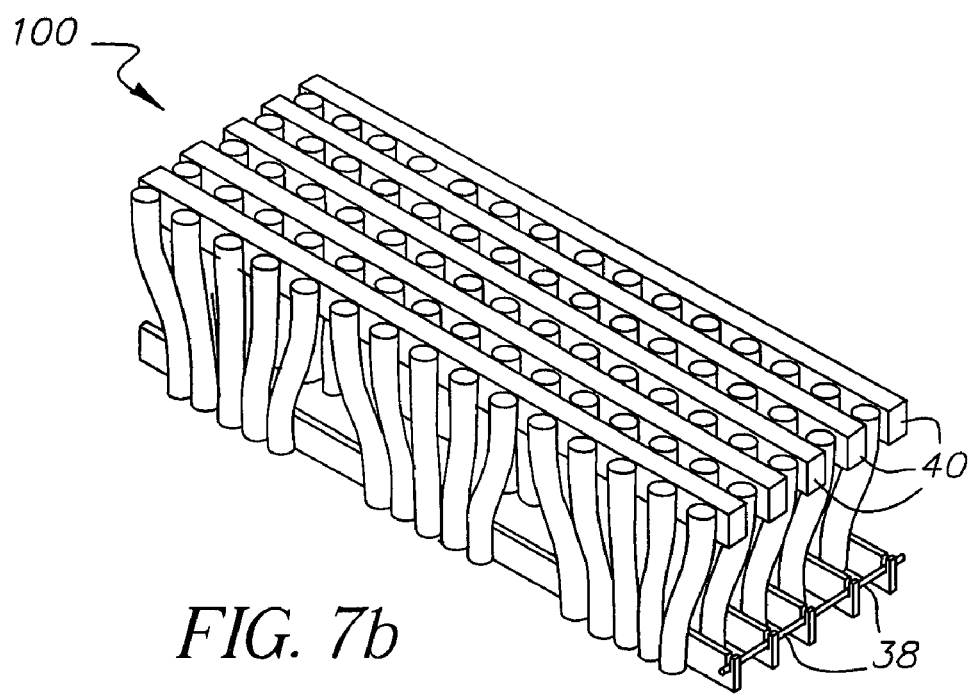

FIGS. 7a and 7b show, from a perspective view, a sequence in which ribbon structures 40 are stacked against each other for assembly of a fiber optic faceplate 100. In FIG. 7a, a series of alignment slots 36 are provided for lining up adjacent ribbon structures 40. As FIG. 7b shows, an alignment pin 38 or other locating structure can be used to fix the relative positions of adjacent ribbon structures 40.

Figure 8:
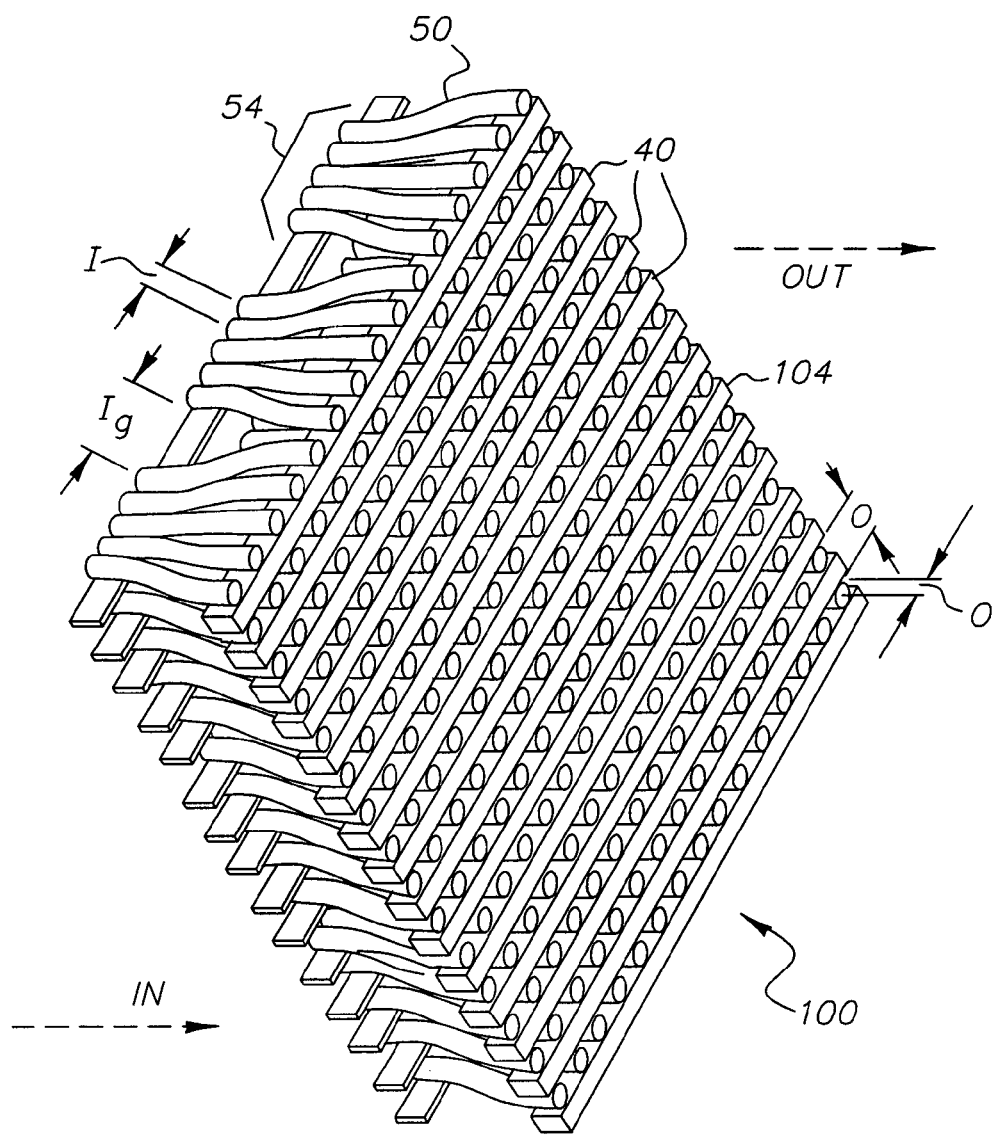
FIG. 8 shows a perspective output side view of a small segment of a fiber optic faceplate fabricated using the methods of the present invention.

FIG. 8 shows a perspective view from an output face 104 of a segment of fiber optic faceplate 100 fabricated according to the methods of the present invention. On the input side, a cluster 54 could be useful, whereby a set of fiber segments 50 is routed to a smaller area, with gaps between clusters 54 defined by the distance $I_g$ within ribbon structure 40, as was described above. As is shown in FIG. 8, output edge fiber-to-fiber spacing O is typically the same between fiber segments 50 within a ribbon structure 40 and between adjacent ribbon structures 40. Likewise, input edge fiber-to-fiber spacing I would be equal in orthogonal directions, at least within cluster 54. Input edge fiber group distance $I_g$ would be maintained between clusters 54. For added rigidity and support additional spacing structures could be used to maintain input edge fiber group distance $I_g$ within ribbon structure 40. Additional orthogonal support structures could also be used.

Figure 9:
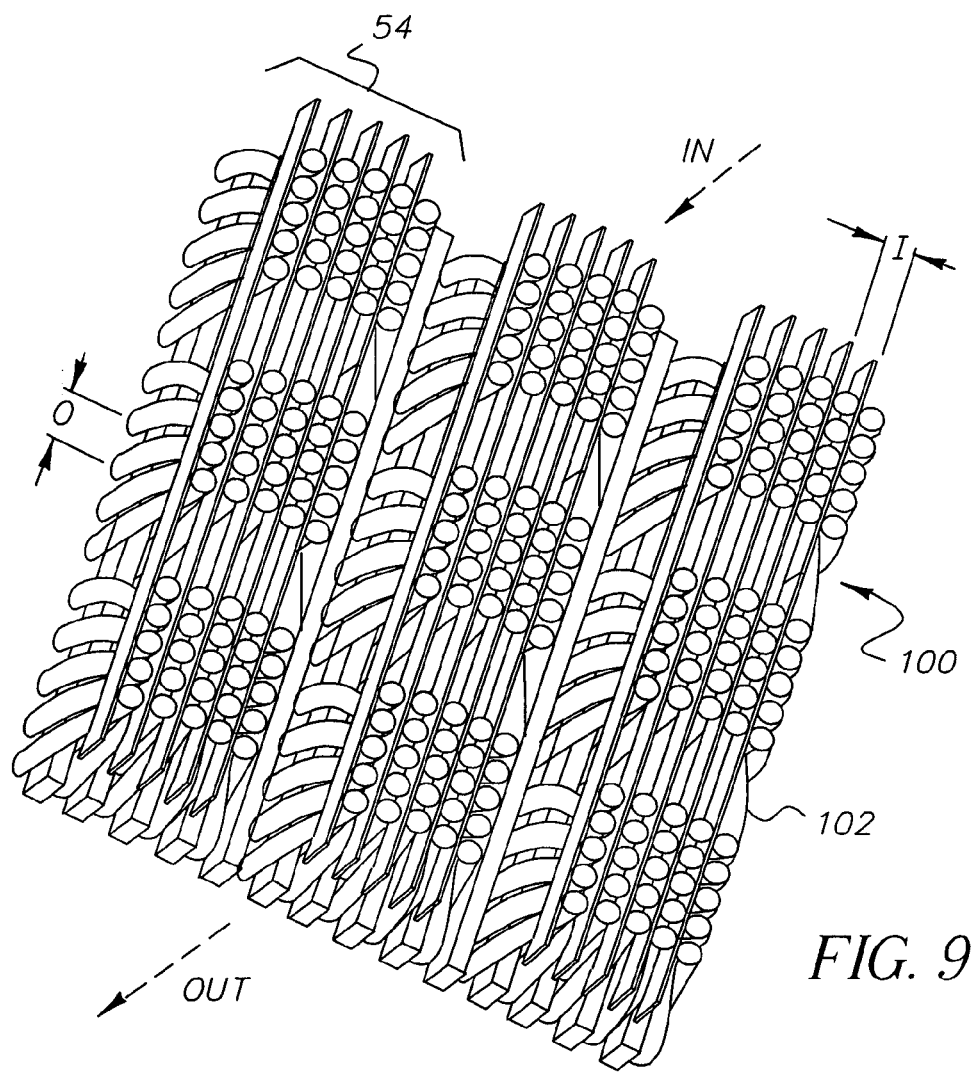
FIG. 9 shows a perspective input side view of a small segment of a fiber optic faceplate fabricated using the methods of the present invention.

FIG. 9 shows a perspective view from an input face 102 of a segment of fiber optic faceplate 100 fabricated according to the methods of the present invention, with one cluster 54 highlighted in a dotted box.

Figure 13:
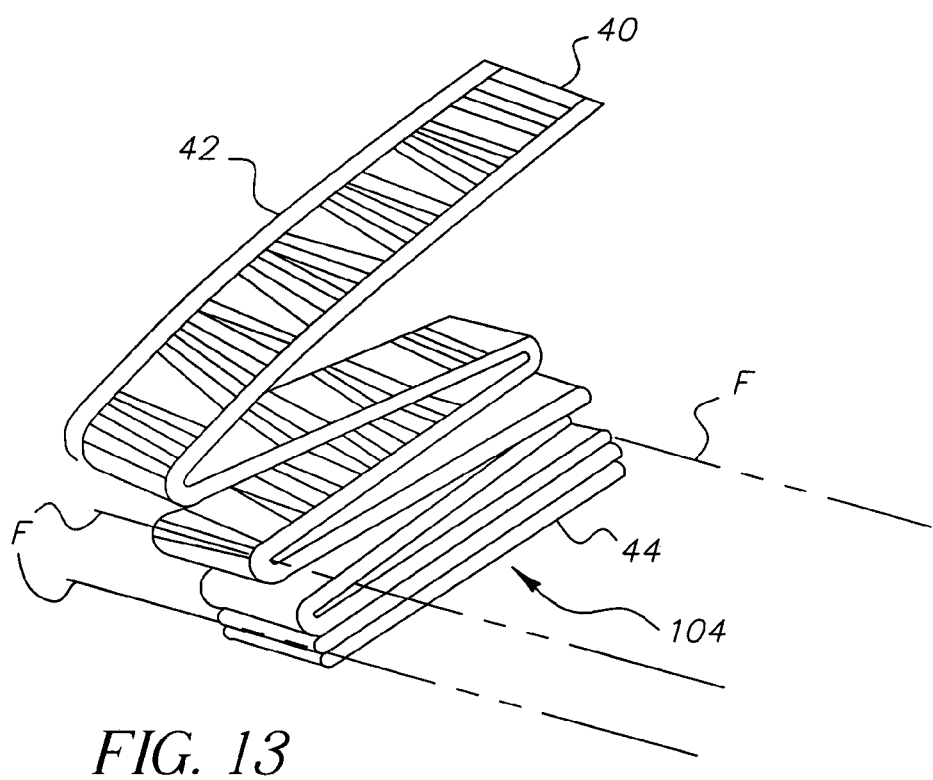
FIG. 13 shows a perspective view of fiber optic faceplate fabrication using individual folded ribbon structures fabricated using the apparatus and methods of the present invention.

For forming fiber optic faceplate 100, ribbon structures 40 can be individually cut and stacked together, one ribbon structure 40 at a time. Alternately, folding methods could be used to form fiber optic faceplate 100. In one embodiment, for example, shown in the perspective view of FIG. 13, ribbon structure 40, fabricated to have a length that is several times the width dimension of the final assembled fiber faceplate 100, is folded back on itself one or more times at fold lines F to build up the rows of fiber faceplate 100 structure.

Figure 10:
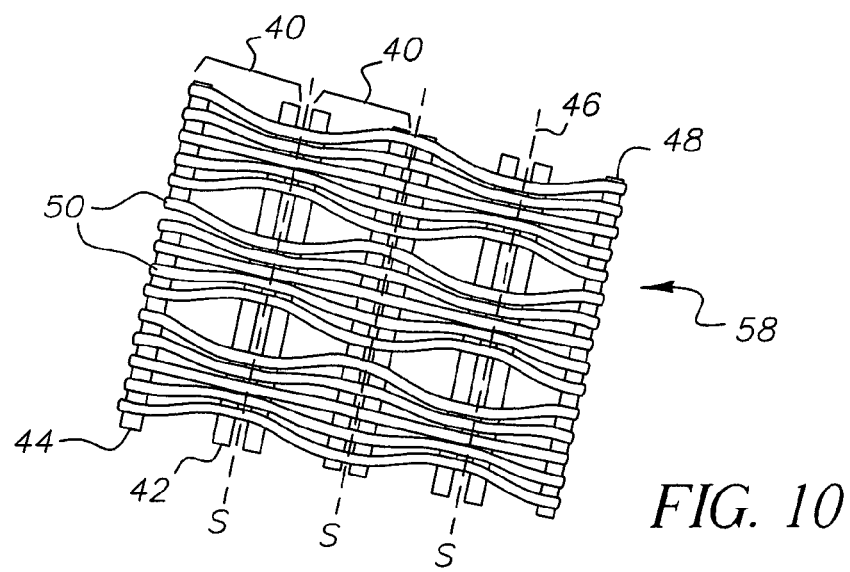
FIG. 10 shows an arrangement with multiple parallel ribbon structures as fabricated using the apparatus of the present invention.
Figure 11A:
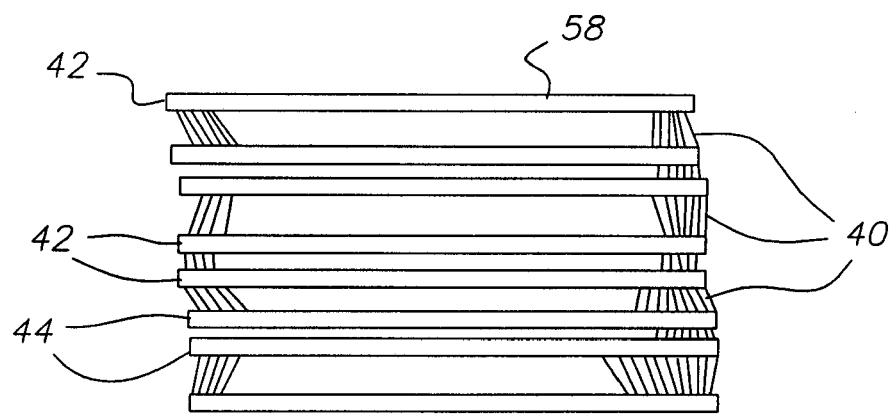
FIGS. 11a and 11b show perspective and side views, respectively, of fiber optic faceplate fabrication from ribbon structures of the present invention.
Figure 11B:
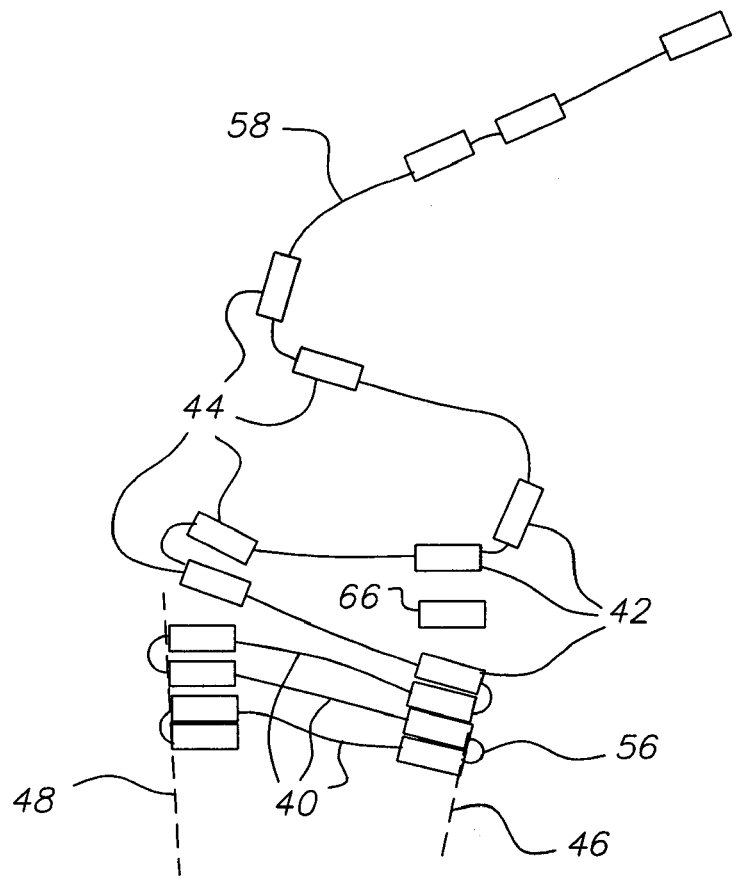

Another alternative method builds fiber faceplate 100 following a sheet-based model. Referring to FIG. 10, there is shown a segment of four individual ribbon structures 40 provided as a sheet of ribbon structures 58 upon completion of assembly on mandrel 16. At some point, ribbon structures are severed at separation lines S so that input edges 46 and output edges 48 can be aligned. As was noted above with reference to FIG. 4, this severance can be obtained by cutting means or using heat and can be performed when ribbon structures 40 are fabricated on mandrel 16. However, as is shown in FIGS. 11a and 11b, the method of the present invention also allows a novel way of stacking ribbon structures 40 using an accordion-fold method. FIG. 11a shows a perspective view in which a plurality of ribbon structures 40 on a sheet of ribbon structures 58 are folded together in accordion-fold style. FIG. 11b shows the accordion-fold method from a side view. For this method, sheet of ribbon structures 58 is folded between each pair of adjacent input edge spacers 42 and between each pair of adjacent output edge spacers 44. Individual ribbon structures 40 are thereby aligned to form an input edge 46 and an output edge 48 as shown in FIG. 11b.

Once ribbon structures 40 are appropriately aligned so as to form input face 102 and output face 104, finishing operations can be performed. These processes provide final shaping, encasing materials, and surface finishing operations, and may also employ methods for improving the optical performance of assembled fiber optic faceplate 100.

Finishing operations may include severing of any loops 56 that remain between ribbon structures 40 as shown in FIG. 11b, for example. Referring back to FIG. 2, cut groove 34 may be suitably dimensioned with additional width to accommodate accordion-fold methods.

Heat may be employed for shaping the ends of optical fiber segments 50. For example, heat may be applied to shape the end of each optical fiber segment 50, forming an integral lens structure for each fiber segment 50 thereby. Alternately, heat and pressure may be applied to broaden fiber diameter on one or both input and output edges 46, 48.

Any number of types of interstitial substances can be used for filling spaces between optical fiber segments 50. Interstitial materials may comprise plastics, resins, epoxies, or other suitable materials, including materials selected for specific optical properties, such as for light guiding. Black interstitial material, or interstitial material having a specific optical index could be employed to prevent unwanted effects, such as cross-talk between fiber segments 50. Fiber optic faceplate can be finished by immersion into a hardening liquid of some type.

It must be noted that interstitial substances would be optional, since there may be uses for which a flexible optical faceplate arrangement is most advantageous. For example, there may be applications in which dithering or other mechanical movement or flexibility is useful.

Coatings might also be applied to output face 104 as part of a finishing operation. Coatings could be used for anti-reflective properties or for providing a suitable surface for mounting purposes. Favorable optical effects can be accomplished by the use of additional optical components applied to output face 104 as part of a finishing process. Auxiliary optical components and coatings could be used to provide polarization, such as circular polarization provided at output face 104, for example.

One key problem in fiber optic faceplate fabrication relates to fiber alignment to individual light sources in an array or "pixel-to-pixel" alignment. This problem has not been satisfactorily solved for high-density imaging applications using the conventional fabrication methods described in the background material above. Instead, some type of workaround has been used, such as generally grouping multiple fibers for a single light source so that at least some of the fibers receive the intended light. However, such a solution does not provide pixel-to-pixel alignment and clearly constrains the resolution of the fiber optic faceplate structure.

Using the method of the present invention, the arrangement of ribbon structure 40 allows for correct pixel-to-pixel spacing within a row of light sources in an array and between rows, using input and output edge spacers 42 and 44, as described above. Alignment of individual rows of ribbon structure 40 to each other can be provided by mechanical methods, such as using the alignment slot 36/alignment pin 38 arrangement shown in FIGS. 7a and 7b, for example. Other alignment methods that could be used include fabrication of input or output edge spacers 42 and 44 with interlocking members. A jig or other mechanical alignment device could be employed, aligning ribbon structure 40 segments to each other using a sequence of spaced slots or other physical features. Magnets could also be employed for obtaining row-to-row alignment, with input or output edge spacers 42 and 44 using magnetic components or ferrous materials.

For display and printing applications, alignment of individual optical fiber segments 50 to corresponding pixels is necessary. To support alignment of complete, fabricated fiber optic faceplate 100, its composite ribbon structures 40 may be provided with mechanical features such as holes, detents, sockets, pins, and the like. Alternately, magnets and ferrous components may be built into or added onto composite ribbon structure 40.

Figure 16:
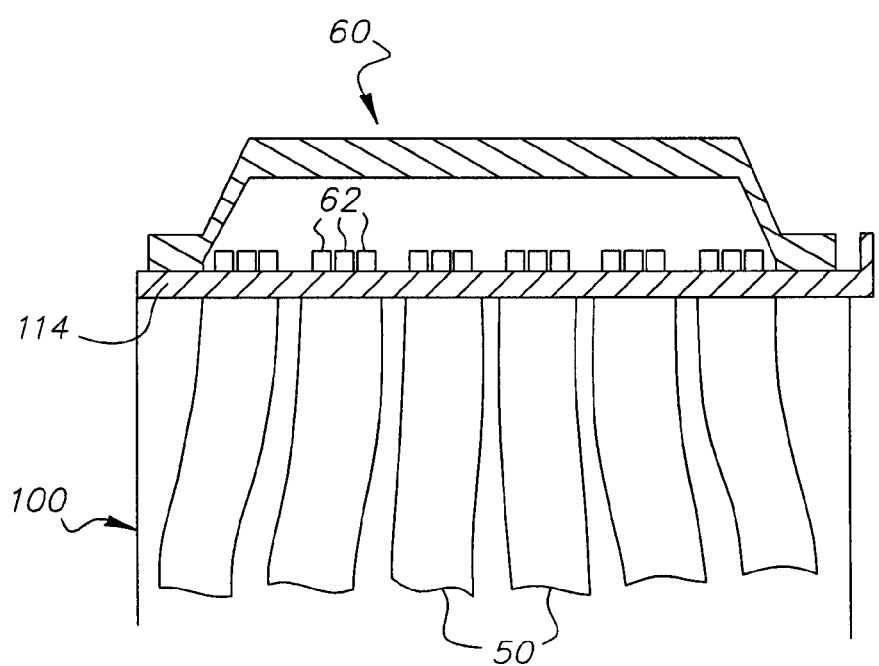
FIG. 16 shows a cross sectional view of an emissive device fabricated against a fiber optic faceplate built according to the present invention.

An alternate solution shown in FIG. 16 provides an inherent alignment of pixel light sources to optical fiber segments 50. In the arrangement of FIG. 16, an emissive display 60, such as an OLED (Organic Light Emitting Diode), is fabricated directly against a surface 114 of fiber optic faceplate 100. This allows individual pixels 62 to be formed directly against their corresponding fiber optic segments 50 that serve as light pipes. FIG. 16 shows a possible arrangement for a bottom emitter OLED. Pixels 62 can be directly deposited in place for precise alignment. Similarly, a top emitting OLED could be fabricated on top of or directly against fiber optic faceplate 100.

Emissive display 60 could be an OLED, a PLED (Polymer Light Emitting Diode), or an LED array, for example.

Figure 14A:
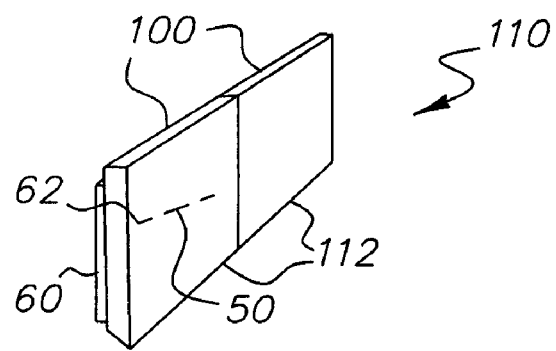
FIGS. 14a and 14b show perspective and plane views, respectively, of a tiled display using fiber optic faceplates fabricated using the methods and apparatus of the present invention.
Figure 14B:
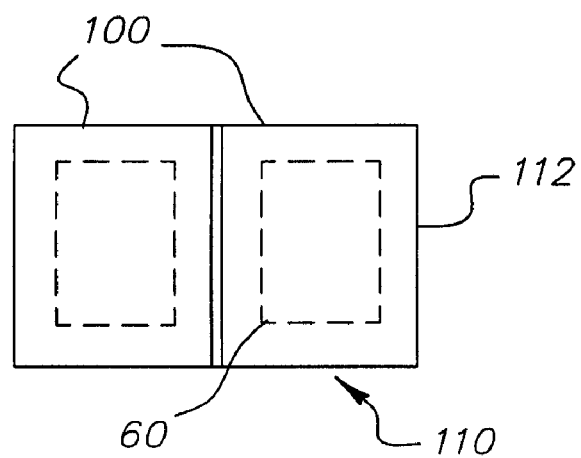

When fabricated using the methods of the present invention, fiber optic faceplate 100 is well-suited for tiling applications. Referring to FIGS. 14a and 14b, there is shown a tiled display 110 that generates an image from multiple emissive display devices 60 as multiple tiles 112. In a preferred embodiment, emissive display device 60 is an OLED. Each individual emissive display device 60 provides one tile 112 of the image. As the plane view of FIG. 14b shows, fiber optic faceplates 100 can be used to enlarge the size of the image from emissive display device 60 (shown in dashed outline in FIG. 14b). As is represented in FIG. 14a, pixel-to-pixel alignment can be provided, so that each fiber segment 50 directs light from a single pixel 62 on emissive display device 60 to its position on image tile 112. Fiber optic faceplates 100 can be aligned with each other using mechanical interlocks or magnets, for example. Ribbon structures 40 in adjacent image tiles 112 could be offset from the edges of their fiber optic faceplates 100, allowing interdigitation as a method for coupling adjacent image tiles 112.

The use of ribbon structures 40 allows considerable flexibility for adapting the dimensions and curvature of fiber optic faceplate 100. By changing the length of ribbon structure 40 segments, various arrangements of height and width could be obtained. Ribbon structures 40 could be wrapped in a number of different ways to adapt the shape of fiber optic faceplate 100.

Figure 15:
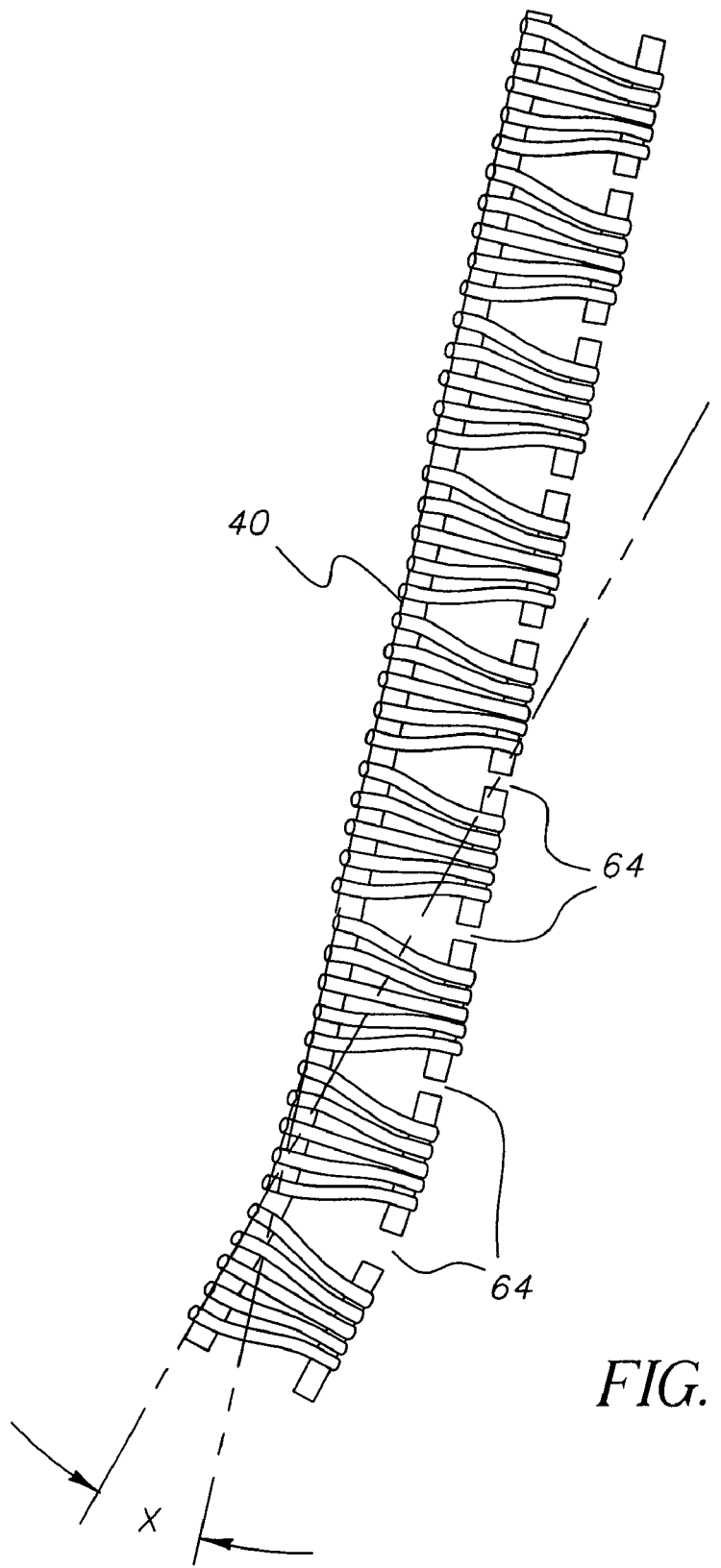
FIG. 15 shows how a ribbon structure can be adapted to provide a curvature for fiber optic faceplate fabrication.

Slight adaptations to input and output edge spacers 42 and 44 would allow ribbon structures 40 to be combined to provide a curvature to output face 104. Referring to FIG. 15, ribbon structure 40 is adapted for curvature with a number of slits 64 in input edge spacer 42 to yield the curvature shown. Curvature could be in either convex or concave direction. Shaping can be further enhanced by providing relief cuts in output edge spacer 44 or by trimming or contouring output edge 48, for example. Using a combination of curvature and tiling, large display structures could then be assembled using the techniques of the present invention.

Using the fabrication methods of the present invention, fiber optic faceplate 100 can have a number of alternate embodiments. Fiber optic faceplate 100 could be a tapered faceplate. Optical fiber segments 50 would typically have the same nominal width for most applications, however, there might be embodiments where ribbon structures 40 use optical fiber segments 50 having different radius dimensions. There may also be embodiments in which ribbon structures 40 comprise optical fiber segments 50 having different shapes, such as non-circular shapes, for example. Referring to FIG. 11b, an auxiliary spacer 66 could be added between ribbon structures 40 in any stacking arrangement. A fitted auxiliary spacer 66 could be employed at either input edge 46 or output edge 48, such as for providing improved adhesion to optical fiber segments 50.

It is instructive to note that the terms "input" and "output" as used in this specification are relative terms and could be reversed. The sense in which these terms are used herein relates to use of fiber optic faceplate 100 as part of a display, including a tiled display, for example. Fiber optic faceplate 100 could alternately be used as part of a light-gathering instrument, in which case the input side would typically require larger fiber-to-fiber spacing to direct light to a small sensing component on the output side. The method of the present invention allows fabrication of a fiber optic faceplate 100 used in either orientation, providing an optical converter with variable spacing at opposite faces or with equal spacing if needed.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, fiber optic faceplate components manufactured using the methods and apparatus of the present invention could be any of a range of sizes. Various methods could be applied for finishing, packaging, and tiling fiber optic faceplates that have been fabricated using the methods and apparatus of the present invention. Therefore, what is provided is an improved apparatus and method for forming a fiber optic faceplate.

PARTS LIST 10 fiber optic faceplate forming apparatus
12 fiber optic source
14 optical fiber strand
16 mandrel
18 wound spiral
20 ribbon forming channel
22 input spacing guides
24 output spacing guides
26 groove
27 groove
30 edge spacer applicator
32 fiber group
34 cut groove
36 alignment slot
38 alignment pin
40 ribbon structure
40' partially fabricated ribbon structure
42 input edge spacer
44 output edge spacer
46 input edge
48 output edge
50 optical fiber segments 52 nichrome wire
54 cluster
56 loop
58 sheet of ribbon structures
60 emissive display device
62 pixel
64 slit
66 auxiliary spacer
100 fiber optic faceplate
102 input face
104 output face
110 tiled display
112 image tile
114 surface structure

What is claimed is:

1. A fiber optic faceplate, comprising:
a series of stacked ribbon structures, each ribbon structure comprising a single row of adjacent optical fibers, each optical fiber running from an input edge to an output edge of said ribbon structure, the length of each optical fiber thereby determining a depth dimension of said ribbon structure, each fiber having, relative to an adjacent fiber, an input spacing at said input edge and an output spacing at said output edge for directing light from an input position to an output position respectively, wherein the input spacing at the input edge is provided by a first spacer having a first constant thickness and the optical fibers are arranged at a first variable angle along the length of the first spacer and the output spacing at the output edge is provided by a second spacer having a second constant thickness different from the first constant thickness and the optical fibers are arranged at a second variable angle along the length of the second spacer.

2. A fiber optic faceplate according to claim 1, wherein each said stacked ribbon structure further having, relative to an adjacent ribbon structure, an input row-to-row spacer for setting the distance between said input edges, each said stacked ribbon structure further having, relative to an adjacent ribbon structure, an output row-to-row spacer for setting the distance between said output edges.

3. A fiber optic faceplate according to claim 2, wherein said input row-to-row spacer is plastic.

4. A fiber optic faceplate according to claim 2, wherein said input row-to-row spacer is magnetic.

5. A fiber optic faceplate according to claim 1, further comprising a filler material for securing each said optical fiber in place.

6. A fiber optic faceplate according to claim 1, wherein said optical fibers in said each ribbon structure have the same radius dimension.

7. A fiber optic faceplate according to claim 1, wherein said optical fibers in said each ribbon structure have a plurality of shapes.

8. A fiber optic faceplate according to claim 5, wherein said filler material is black.

9. A fiber optic faceplate according to claim 5, wherein said filler material comprises a reflective material.

10. A fiber optic faceplate according to claim 1, wherein said optical fibers are circular in cross-section.

11. A fiber optic faceplate according to claim 1, wherein said optical fibers are non-circular in cross-section.

12. A fiber optic faceplate according to claim 1, wherein successive stacked ribbon structures differ in said depth dimension.

13. A fiber optic faceplate according to claim 1, wherein successive stacked ribbon structures are formed with a predetermined curvature.

14. A fiber optic faceplate according to claim 1, further comprising a coating.

15. A fiber optic faceplate according to claim 1, further comprising a polarizer at said output edge.

16. An image forming device comprising:
(a) an emissive device comprising a spaced array of light-emitting components; and
(b) a fiber optic faceplate, comprising a plurality of stacked ribbon structures, each ribbon structure a single row of adjacent optical fibers, each optical fiber running from an input edge to an output edge of said ribbon structure, the length of each optical fiber thereby determining a depth dimension of said ribbon structure, each fiber having, relative to an adjacent fiber, an input spacing at said input edge and an output spacing at said output edge for directing light from an input position to an output position respectively, wherein the input spacing at the input edge is provided by a first spacer having a first constant thickness and the optical fibers are arranged at a first variable angle along the length of the first spacer and the output spacing at the output edge is provided by a second spacer having a second constant thickness different from the first constant thickness and the optical fibers are arranged at a second variable angle along the length of the second spacer.

17. An image forming device according to claim 16, wherein said emissive device is taken from the group consisting of OLED, PLED, LED.

18. An image forming device according to claim 16, wherein said emissive device is fabricated against said fiber optic faceplate.

* * * * *